(12) United States Patent
Wegerer et al.

(10) Patent No.: US 7,485,500 B2
(45) Date of Patent: Feb. 3, 2009

(54) CHIP MODULE AND METHOD FOR PRODUCING A CHIP MODULE

(75) Inventors: Gabriele Wegerer, Munich (DE); Christine Kallmayer, Falkensee (DE); Frank Ansorge, Munich (DE); Christian Rebholz, Igling (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 92 days.

(21) Appl. No.: 11/553,384

(22) Filed: Oct. 26, 2006

(65) Prior Publication Data

US 2007/0134848 A1   Jun. 14, 2007

Related U.S. Application Data

(63) Continuation of application No. PCT/EP2005/003958, filed on Apr. 14, 2005.

(30) Foreign Application Priority Data

Apr. 28, 2004   (DE)   ................ 10 2004 020 877

(51) Int. Cl.
  *H01L 21/60* (2006.01)
(52) U.S. Cl. ............................ 438/125; 257/E21.511
(58) Field of Classification Search ................. 438/125
  See application file for complete search history.

(56) References Cited

U.S. PATENT DOCUMENTS

| 5,236,873 A | 8/1993 | Anceau et al. ............. 438/113 |
| 5,264,061 A | 11/1993 | Juskey et al. ................ 156/214 |
| 2001/0036718 A1 | 11/2001 | Williams .................... 438/597 |
| 2002/0117701 A1 | 8/2002 | Sun et al. .................... 257/295 |
| 2004/0046250 A1 | 3/2004 | Chua et al. |

*Primary Examiner*—W. David Coleman
(74) *Attorney, Agent, or Firm*—Michael A. Glenn; Glenn Patent Group

(57) ABSTRACT

A chip module comprises a chip with a chip contact, an insulating structure, which covers the chip and the chip contact at least partly, and a spare contact at an external surface of the insulating structure and a conductive trace for electrically connecting the chip contact to the spare contract.

6 Claims, 7 Drawing Sheets

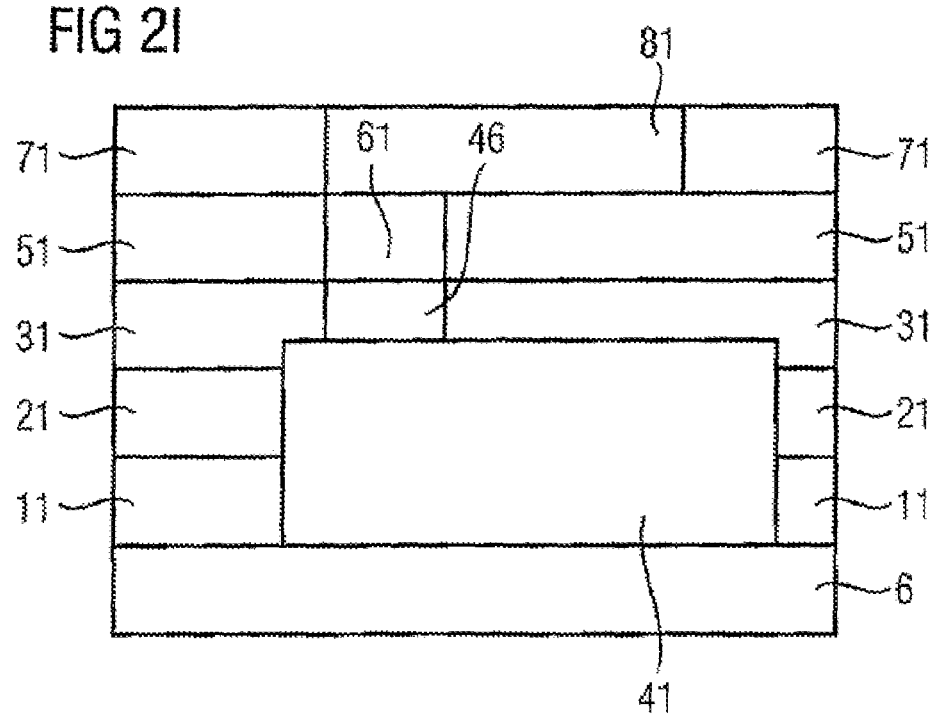
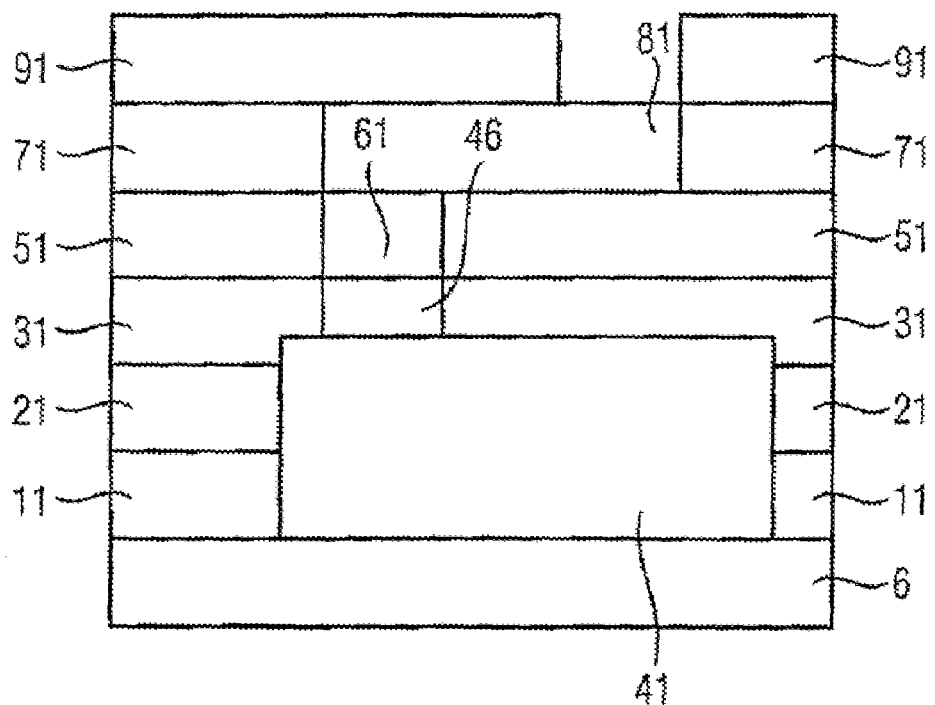

CHIP MODULE AND METHOD FOR PRODUCING A CHIP MODULE

CROSS-REFERENCE TO RELATED APPLICATION

This application is a continuation of copending International Application No. PCT/EP2005/003958, filed Apr. 14, 2005, which designated the United States and was not published in English.

BACKGROUND OF THE INVENTION

1. Field of the Invention

The present invention relates to a chip module and a method for producing a chip module and particularly to a chip module with a spare contact.

2. Description of the related art

Unhoused chips or bare dices, respectively, are increasingly used in miniaturized devices, such as PDAs or mobile phones. An advantage of the usage of those bare dices is that they have smaller geometrical dimensions than housed chips. At the same time, an increasingly fast moving behavior of consumers buying those devices presents a requirement to reduce development times of miniaturized devices, such as PDAs or mobile phones.

For developing a miniaturized device, production of a prototype is frequently required, Here, bare dices are required to have contacts for connecting with a circuit board in different embodiments of a prototype at different positions.

In portable electric devices, such as mobile phones or noteboooks, the ICs become smaller and smaller and at the same time take on more and more functions. A chip for a standard bonding method has, for example, the terminal pads disposed peripherally at the boundary areas of the chip, which today have an area of approximately 75 µm×75 µm; thus, the number of pins is limited, or in extreme cases, the design is determined by the pads, i.e. due to the number of pads, more chip area is required than would be required for the actual function. By so-called rewiring, the bonding pads can be distributed from the boundary zone to the center at any position of the chip surface, which results in significantly more connecting possibilities.

Additionally, due to the flip-chip layout, when the pads are not placed at the chip boundary, there is the possibility to lead the signal out of the chip directly at the position where it is generated.

This method is already realized when depositing the so-called C4 solder bumps, wherein C4 stands for a connecting technology corresponding to so-called controlled collapse chip connection in a flip chip, since this chip is particularly useful for high-frequency applications due to the resulting extremely short paths.

The rewiring, including leading away a contact by depositing an electrically conductive layer, requires a very expensive technique in this case, which uses, for example, methods from thin film technology. The method comes from the chip production itself.

In an embodiment according to the prior art, rewiring of a bare dice is performed via production methods used in chip production.

Thereby, preferably, so-called lithography is used. Here, a photoresist is deposited on an already completely produced wafer, which is provided for a plurality of unhoused chips or bare dices, or from which a plurality of unhoused chips or bare dices are to be retrieved by dicing. A light-sensitive photoresist is exposed to light, normally in the UV light range, via a lithographic mask, which includes a map of the chip design. After chemical development, an exposed part of the photoresist, which is not covered by the mask, is removed in a positive photoresist. Then, a corresponding structure predetermined by a mask can be etched off from the sub-material below the photo mask, with an acid that does not attack a photoresist. Rewirings are then produced layer by layer, by successively repeating exposure and selective ablation or depositing processes. Thereby, every layer requires an individual lithographic mask, which again requires complex production techniques.

In that way, holes and trenches are generated, which are then galvanically filled with a metal—preferably copper or gold. Preferably, holes are only generated in the resist that will be removed again, while holes, for example, for vias, can also be generated in the dielectric. Then, a rewired wafer, which is provided for a collection of bare dices, can be provided with so-called bumps. Providing a wafer with bumps can, for example, be performed galvanically, or, if large center-to-center distances exist—wherein large center-to-center distances mean preferably distances of more than 200 µm—via inexpensive mask printing processes.

All processes used in the above embodiment according to the prior art, are so-called wafer level technologies, which are characterized in that they can only be performed on a complete wafer, which means in a state where the wafer has not yet been diced into unhoused dices.

Thus, a water comprises a number of prototypes, which all have an identical configuration of contacts on the chip. The number of produced identical prototypes is thus always a plurality of a number of the prototypes, which a single wafer comprises. Thus, the method for producing prototypes with rewired contacts is inflexible.

Another disadvantage is that a plurality of process steps requires producing a bare dice with the rewired contacts. Thus, the production method becomes expensive. The number of process steps has also the effect that the production of a chip with the rewired contact requires a longer production time. This has an adverse effect on a development cycle of a new device, which uses these unhoused chips with rewired contacts for development purposes. Additionally, every configuration of a bare dice with rewired contacts requires a new mask set. Since a production of a new mask set is very cost intensive, this opposes the requirement for low development costs.

At the same time, production of a low number or a single wafer at a front-end location, where mass production of wafers is typically performed, is hard to implement due to the production processes run there. This also opposes a low cost production of prototypes of rewired chips, which again causes an increase of development costs.

US-2001/0036718 A1 discloses a stereolithography method for processing semiconductor devices. Here, a semiconductor device or a substrate, respectively, is disposed on a platform. The substrate can be fixed or the platform via stereolithographically-produced supports to avoid lateral movements of the substrate. A material layer is formed on the substrate disposed on the platform via a stereolithography method.

Thus, a dielectric layer is disposed on a semiconductor device with bond pads on the active surface of the semiconductor device, and then conductive elements are disposed thereon, which are electrically connected to the bond pads. The dielectric layer insulates the laterally extending areas of the conductive elements. Again, a protective layer is disposed on the conductive elements, wherein the conductive elements have contacts extending through the protective layer. Thereby, the contacts comprise conductive structures, such as solder bumps.

The conductive elements, the conductive structures, the dielectric layer and protective layer are generated via stereolithography methods.

U.S. Pat. No. 5,264,061 A discloses a method for forming a three-dimensional circuit board. A substrate for the three-dimensional circuit board is generated via a stereolithography technique. Then, a conductive circuit structure is formed on the substrate generated with the stereolithography method. In a further step, the substrate is reformed into the desired three-dimensional form.

SUMMARY OF THE INVENTION

It is an object of the present invention to provide a chip module with a spare contact and a method for producing a chip module with a spare contact wherein the provision of the spare contact can be more easily obtained.

The present invention provides a method for producing a chip module, having the steps of: providing a chip with a chip contact; preparing a first part of the insulating structure having a recess; introducing the chip with a chip contact into the recess of the first part of the insulating structure; generating a second part of the insulating structure via a stereolithography step, so that the second part of the insulating structure covers the chip and the chip contact at least partly, the step of generating having the following substeps: distributing a synthetic resin on an exposed side of the chip, so that the synthetic resin penetrates into a gap between the recess and the chip and seals the gap; exposing and curing the synthetic resin such that the chip contact is in a hole of a cured synthetic resin layer; forming a conductive trace, which is connected to the chip contact in the hole of cured synthetic resin layer in an electrically conductive way; and depositing a spare contact on the external surface of the insulating structure, so that the spare contact is connected to the chip contact via the conductive trace in an electrically conductive way; the step of forming a conductive trace having the following substeps: providing the second part of the insulating structure with a recess; and introducing a conductive material into at least part of the recess via application by doctor to form at least part of the conductive trace.

The present invention is based on the knowledge that a spare contact on an external surface of an insulating structure, which at least partly surrounds a chip and a chip contact, can be connected to the chip contact via a conductive trace in an electrically conductive way, wherein the position of the spare contact can be redefined for every produced chip module.

The chip module according to the present invention can be produced according to an embodiment of the present invention in a simple production method, where, for example, a stereolithographically processed synthetic resin apparatus is used. Since no new mask set has to be produced for a new prototype, a production time for a chip module according to the present invention is reduced. This reduced production time causes a reduced development time for a new device, which uses the chip modules according to the present invention for test purposes, and thus to a faster commercialization of a newly developed device. Additionally, since chips can be rewired, in the diced state, it is possible to fulfill customer specific wishes with regard to the contacting layout after the production of a large and thus low-cost batch of unhoused chips that might have been produced before.

Generating a rewired prototype without having to produce a new mask set has also the effect that the development cost for producing a series of different prototypes can be reduced.

Additionally, a position of the spare contact on the insulating structure can be varied from chip module to chip module, thus, it is not identical for a number of unhoused chips produced on one wafer. This allows larger flexibility with a configuration of prototypes and offers the possibility for a company to produce different configurations for test purposes and then measure them in the devices.

Since a larger number of chips can be produced with chip contacts, which are identically positioned on the chip, the production of these custom specific chips, which are to be processed further, can be implemented cheaper at a front-end location, which is designed for mass production. The position of the spare contact and thus a configuration of a connection between, a support and a bare dice or unhoused chip, respectively, can then be determined by an arrangement of a spare contact in the chip module. Thereby, the cost for prototypes produced in a development process is also reduced.

BRIEF DESCRIPTION OF THE DRAWINGS

These and other objects and features of the present invention will become clear from the following description taken in conjunction with the accompanying drawings, in which:

FIG. 1b is a schematic partial top view of the chip module of FIG. 1a;

FIGS. 2a-l show successive stages during a production method for the chip module 1 of FIGS. 1a and b according to an embodiment of the present invention.

DESCRIPTION OF THE PREFERRED EMBODIMENTS

Figure 1A:
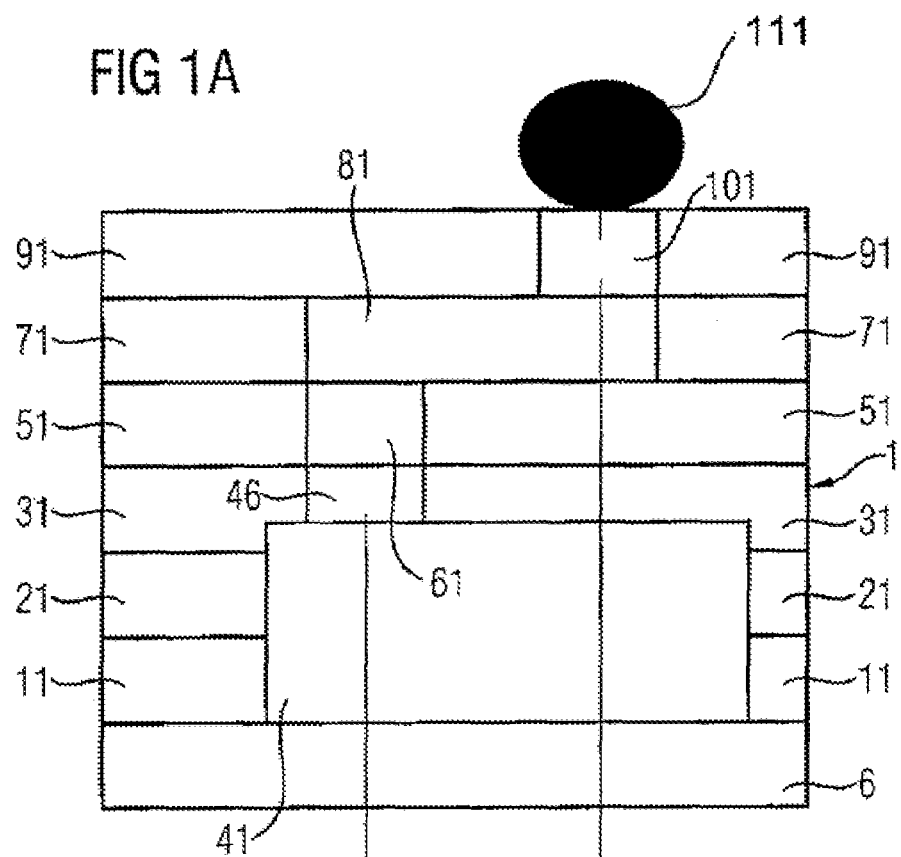
FIG. 1a is a cross-sectional view of a chip module according to the present invention.

FIG. 1a shows a structure of a chip module 1 according to the present invention. The chip module comprises an insulating structure formed from synthetic resin layers 6, 11, 21, 31, 51, 71, 91, a chip 41, a chip contact 46, an electric conductive trace connection formed by a conductive trace contact 61, a conductive trace 81, a conductive trace contact window 101 and a solder bump or contact bump 111. The synthetic resin layers 6, 11, 21, 31 form a recess or cavity, respectively, wherein the unhoused chip 41 is disposed. The chip contact 46 is disposed in a hole of the fourth synthetic resin layer 31. A hole is also introduced into an overlaying top fifth synthetic resin layer 51, where the conductive trace contact 61 is, wherein the conductive trace contact 61 is connected to the chip contact 46. Preferably, the connection between the conductive trace contact 61 and the chip contact 46 is an electrical or mechanical connection of the conductive trace contact 61 and the chip contact 46. An overlaying sixth synthetic resin layer 71 has again a recess where the conductive trace 81 is disposed, which borders on the conductive trace contact 61 and is connected to the same. In a further overlaying seventh synthetic resin layer 91, the conductive trace contact window 101 is introduced in a hole. This conductive trace contact window 101 is connected to the conductive trace 81 in an electrically conductive and mechanical way. A solder bump 111 sits on the conductive trace contact window 101.

By the length, direction and form of the conductive trace 81, the position of the conductive trace contact window 101 and thus also the solder bump 111 sitting thereon can be altered in relation to the conductive trace contact 61 and thus to the chip contact 46. In other words, the geometrical configuration of the conductive trace 81 and the opening 101 determines the position of the solder bump 111, independent of a position of the chip contact 46 on the external surface of the chip 41, wherein the chip contact 46 can always be deposited on the same position on chips of the same type, even when different terminal configurations are desired.

Thus, chip modules 1 can be produced, where the unhoused chip 41 and the chip contact 46 are designed and positioned identically, which differ, however in the position of the solder bump 111 connected to the ship contact 46 in an electrically conductive way, which thus forms a kind of spare contact. In the state shown in FIG. 1, the unhoused chip 41 is rewired by the insulating structure 6-91.

Figure 1B:
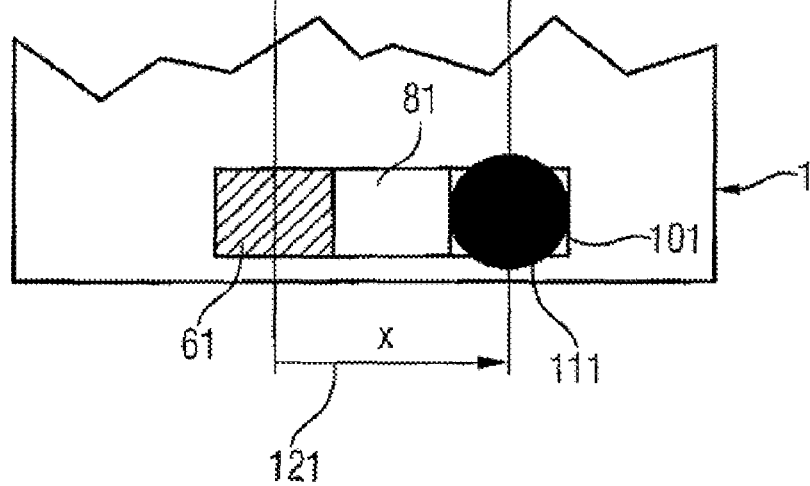

FIG. 1b shows a top view of the chip module 1 of FIG. 1a which shows elements that are exposed and could not be seen in a conventional top view. This figure shows the conductive trace contact 61, the conductive trace 81, the conductive trace contact window 101, the solder bump 111 and a space 121 between solder bump 111 and chip contact 46.

With regard to FIG. 1b, it becomes clear that the solder bump 111 and the conductive trace contact 61, which are disposed at the same position of the area shown here as the chip contact 46, are offset from each other by a space x. Thus, the solder bump 111 is disposed in an offset way in relation to the chip contact 46, which again has the effect that the chip module 1 according to the present invention has a solder bump 111, which is lead away or rewired from the original chip contact 46.

By a variation of configurations of the conductive trace 81, the space between solder bump 111 and chip contact 46 can be altered, whereby the layout of the conductive connections between the chip module 1 and a support not shown here can be adapted.

Figure 2A:

FIGS. 2a-1 show successive stages during a production method for the chip module 1 of FIGS. 1a and b according to an embodiment of the present invention. First, as shown in FIG. 2a, the first synthetic resin layer 6 is produced via stereolithography. Here, a liquid synthetic resin, which can, for example, be formed as photopolymer, is cured by exposition with an UV-laser according to CAD data or corresponding model data, respectively. The model data define the desired form of the later insulating structure surrounding the rewired chip, both with regard to the outer form and the inner areas, particularly the position and form of the cavity for the chip and the conductive trace connection. Here, it should also be noted that further synthetic resin layers could be below the first synthetic layer 6, which are produced in a similar way, but are not shown here for clarity reasons.

Then, the arrangement shown in FIG. 2a, which is on a platform, is lowered by a predetermined layer thickness. The subsequent formation of the other layers of the insulating structure is also performed via stereolithography. Here, first, synthetic material is distributed evenly on a surface of the first synthetic resin layer 6 by a wiper. A moveable mirror is controlled via a computer, whereby the point of impact of a laser light reflected by the mirror can be altered. The laser light is thereby reflected at the mirror such that the synthetic resin cured by the laser light forms the second synthetic resin layer 11. In that way, a local or selective exposition according to the CAD data is obtained. The second synthetic resin layer 11 has a recess into which the chip 41 will be introduced later.

Figure 2B:

The layout produced in that way is shown in FIG. 2b.

Figure 2C:
Figure 2D:
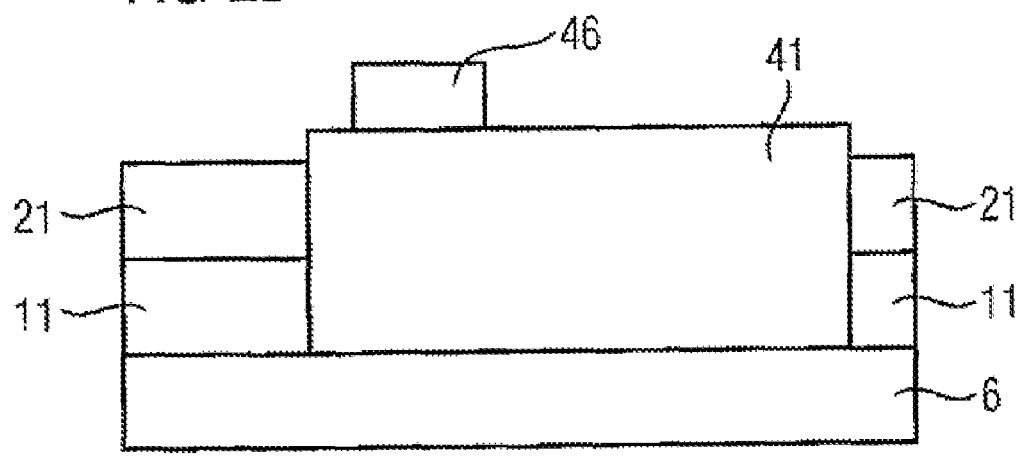

FIG. 2c shows a multilayer structure formed after further stereolithography steps. The same comprises a third synthetic resin layer 21, which has been deposited on the second synthetic resin layer 11 with a wiper, and has then been cured with the laser light.

In a further production step, the chip 41 provided with a chip contact 46 is inserted into a recess of the multilayer structure, which consists of the cured synthetic resin layers 6, 11, 21.

Figure 2E:
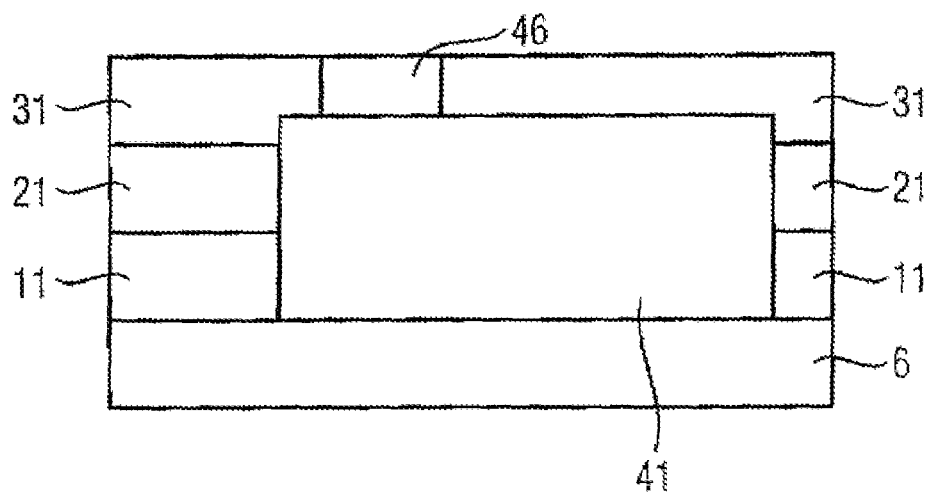
Figure 2F:
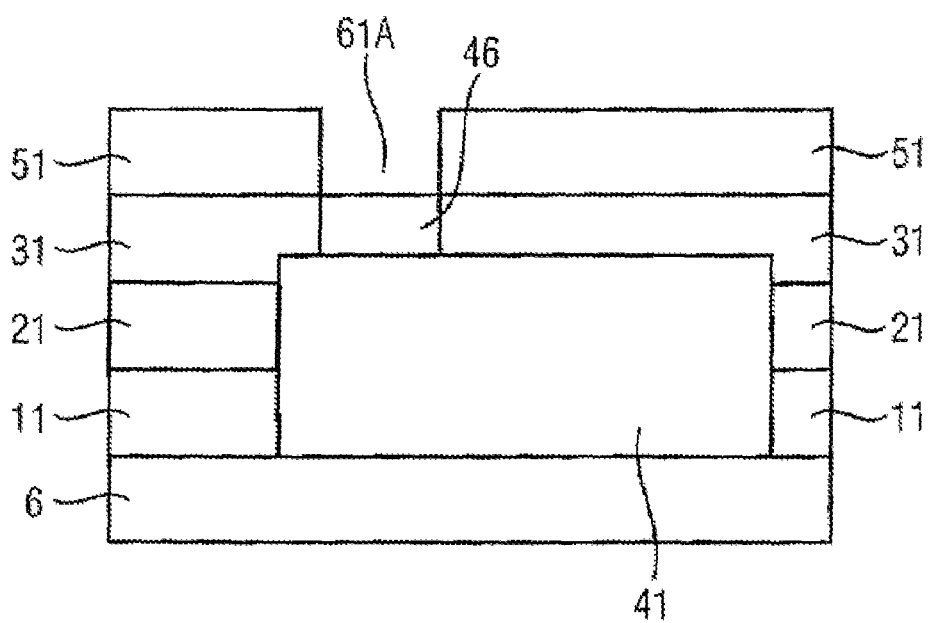

Then, liquid synthetic material, which can be photopolymer, is evenly distributed with a wiper on the chip 41 and provided with the chip contact 46 and third synthetic resin layer 21. Here, it has to be noted that the synthetic resin can also penetrate into the gaps between the chip 41 and the synthetic resin layers 11, 21 and can seal the same. The gaps between the dimensions of the multilayer structure consisting of the synthetic resin layers 6, 11, 21 and the chip 41 are deliberately stored in the CAD data for the stereolithography method, to allow inserting of the chip 41 even when the recess turns out to be smaller in its dimensions at some locations than it should be the case according to the dimensions of the chip 41, due to production tolerances. Then, the fourth liquid synthetic resin layer 31 is again cured with the UV laser. As shown in FIG. 2e, the synthetic resin of the layer 31 is selectively exposed or cured, respectively, such that then the chip contact 46 is in a hole of the fourth cured synthetic resin layer 31, arid the synthetic resin layer 31 extends up to one or several of the surfaces of the chip contact 46 and touches the same.

Figure 2G:
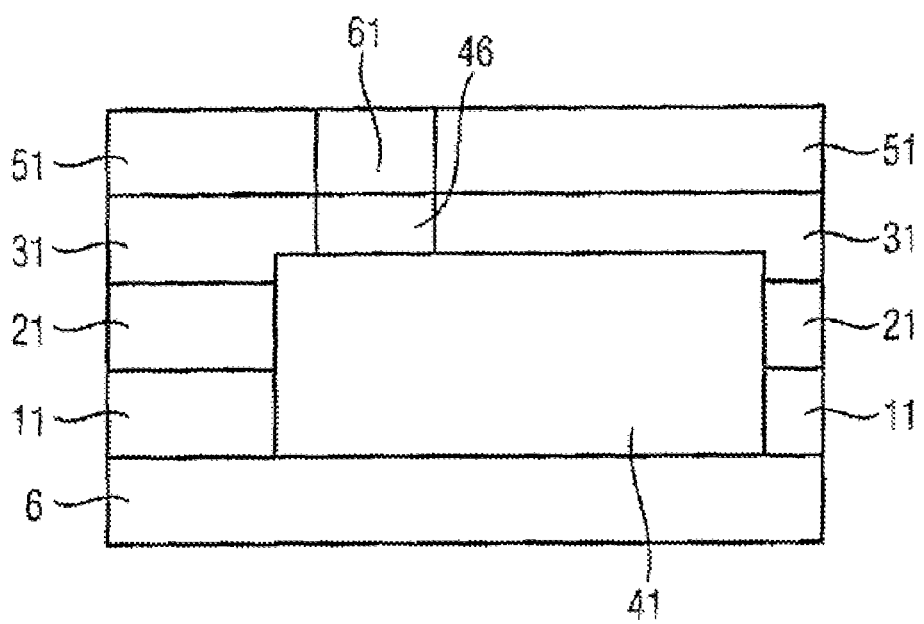

Then, a fifth synthetic resin layer 51 is deposited in a further production step, in which a recess (e.g. 61a) for the conductive trace contact 61, which is aligned to the contact 46, is provided by selective exposure according to the CAD data. Depositing the fifth synthetic resin layer 51 is performed analogously to depositing the previous synthetic resin layers 6, 11, 21, 31. A structure built in that way is shown in FIG. 2g.

Then, via application by doctor, a silver conductive adhesive is inserted in the recess in the fifth synthetic resin layer 51. Then, the silver conductive adhesive is cured. The silver conductive adhesive accumulated and cured in the recess forms the conductive trace contact 61. A structure built in that way is shown in FIG. 2g.

Figure 2H:
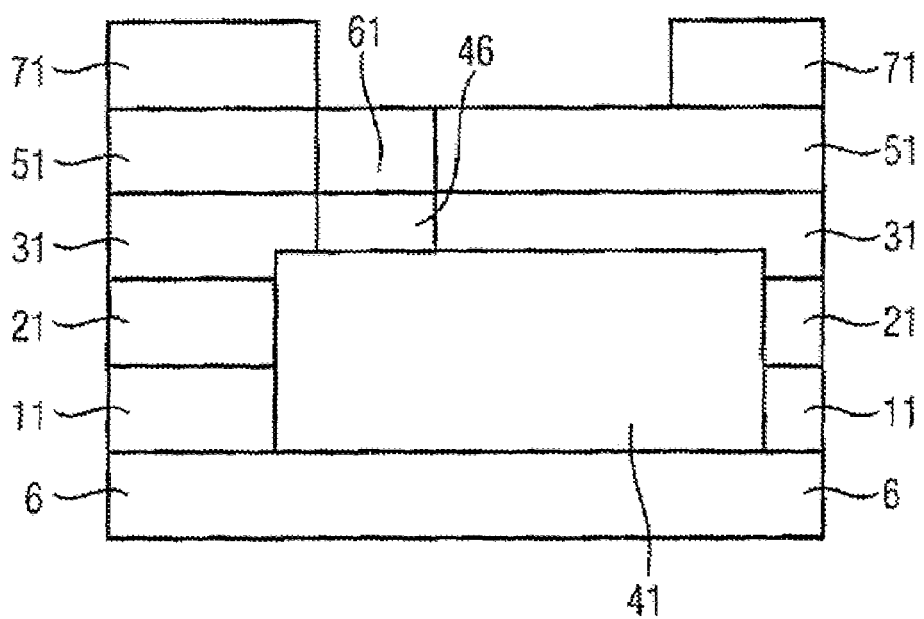

Then, a sixth synthetic resin layer 71 is disposed analogously to the five synthetic resin layers 6, 11, 21, 31, 51 lying below. A recess for the conductive trace 81 is introduced into this sixth synthetic resin layer 71. The structure built that way is shown in FIG. 2h.

Via a further process step, as described above, among others, comprises a step of application by doctor, the conductive trace 81 is produced, as shown in FIG. 2e. FIG. 2j shows a structure of an arrangement as obtained by depositing the seventh synthetic resin layer 91. Again, a recess can be seen in the seventh synthetic resin layer 91, into which the conductive trace contact window 101 is subsequently to be introduced.

Figure 2K:
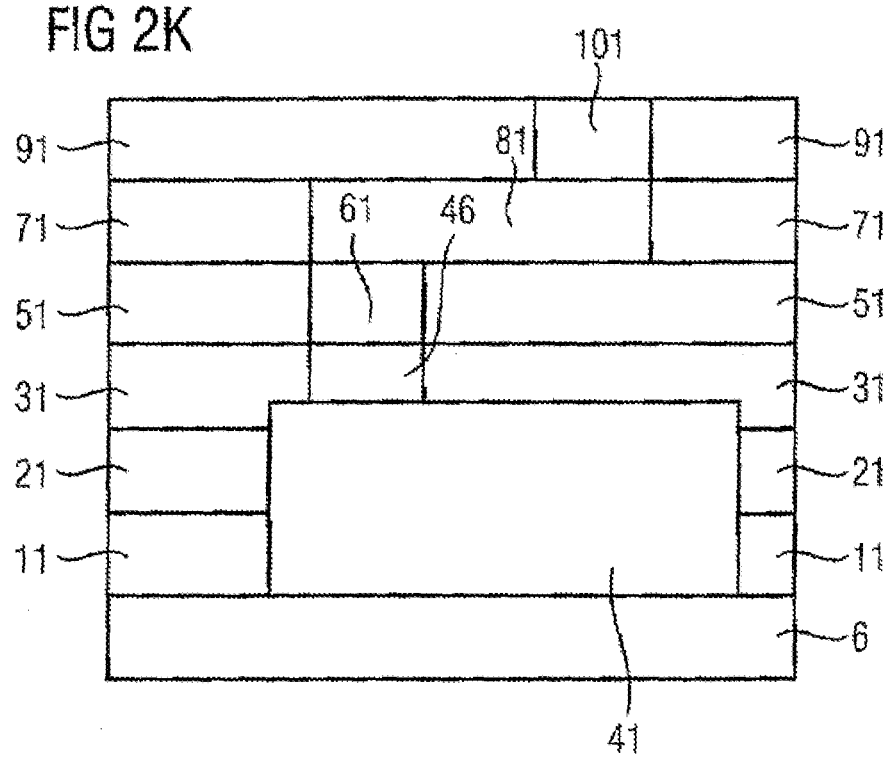

FIG. 2k shows the arrangement produced from FIG. 2j via a further above-described process step, which, among others, comprises a step of application by doctor, wherein again a silver conductive adhesive has been introduced into the recess in the seventh synthetic resin layer 91 via application by doctor, and subsequently cured, which results in the conductive trace contact window 101.

Figure 2L:
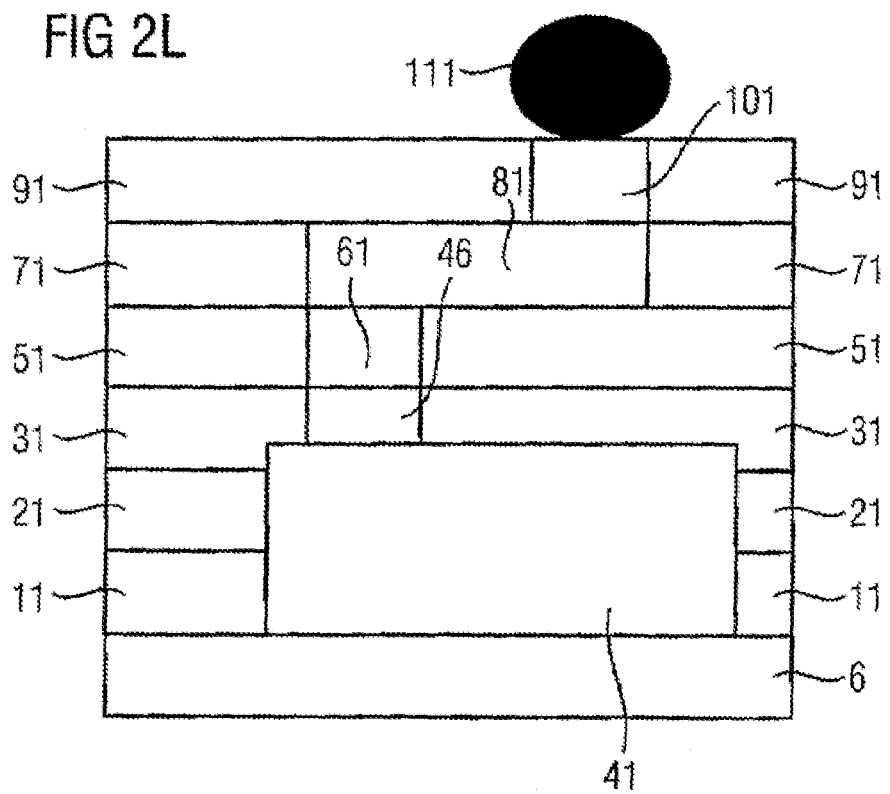

In a final production step, the contact bump 111 is deposited, wherein the contact bump 111 is connected to the conductive trace window 101 in an electrically conductive way. This arrangement is shown in FIG. 2l. The arrangement shown in FIG. 1 can again be connected to a support via the solder bump 111 in an electrically conductive and mechanical way.

In the above embodiments, the silver conductive adhesive for the conductive layers 61, 81, 101 is introduced into a recess of a cured synthetic resin layer 51, 71, 91 via a application by doctor, which has been obtained by even distribution on the underlying layer 31, 51, or 71, respectively, and by selective exposure.

Alternatives are further methods for introducing a conductive material or a starting material for a conductive material into the insulating structure, or for generating the arrangement shown in FIG. 2g from the arrangement shown in FIG. 2e. In a second variation, a stereolithography unit can be used, which comprises two basins with different polymers, e.g. a first polymer for coating the chip in a first basin and a second basin filled with a conductive synthetic resin. Therefore, after finishing the layer 51 with the first polymer or resin, respectively, the model is taken from the first basin, and, if required, rinsed, and dipped into the second basin with the second polymer or resin, respectively, to completely fill the cavities with the second polymer or resin, respectively. The arrangement shown in FIG. 2g is then raised up to the interface between the layers 51, 71. The conductive resin from the second basin remains only in the recess 61a above the chip contact 46 and is there specifically exposed or cured, respectively.

A further alternative or further variation, respectively, for introducing the conductive trace contact 61 into the recess of the fifth synthetic resin layer 51 would be to generate again first the recess 61a, and then, a currentless deposition of nickel or copper into the recess 61a could be performed. Therefore, it is advantageous when the recess 61a in the fifth synthetic resin layer 51 is first seeded with, for example, palladium. Then, the metal is deposited on those seeded areas. The resulting layer thickness depends on the residence time in a bath.

The above-described alternative method steps can also be used for generating the conductive trace 81 and the conductive trace contact window 101. Of course, the variations for producing the conductive connection 61, 81, 101 can also be mixed, for example the variation used in the embodiments can be used for producing the conductive trace contact and the variation 2 can be used for producing the conductive trace 81. Advantageously, the compatibility of the different materials has to be considered.

In the chip module 1 shown in FIG. 1, the solder bump 111 is deposited on the conductive trace contact window 101. Alternatively, a polymer bump or any other bump of conductive material could be deposited on the conductive trace contact window 101 to produce a mechanical and electrically conductive connection to a support. The same could also be omitted.

In the above embodiments, the conductive areas 61, 81, 101 were produced via a silver conductive adhesive. Alternatively, any other conductive materials, such as conductive adhesives can be used for the production of the conductive layers.

In the above embodiments, a single chip contact is rewired. Naturally, a plurality of chip contacts could be or become rewired, respectively, in the above embodiments, or a plurality of chip contacts could be connected to a spare contact.

In the above embodiments, the conductive trace contact 61 and the chip contact 46 are preferably connected to each other in an electrically conductive and mechanical way, this includes also a connection, which connects the conductive trace contact 61 and the chip contact 46 in a chemical way.

The chip module in FIG. 1 shows a diced unhoused semiconductor dice, which can be embodied in different semiconductive materials, such as silicon, germanium or gallium arsenide.

The number of synthetic resin layers in the chip module in FIG. 1 is seven. However, any number of synthetic resin layers is possible to produce the chip module 1.

In the above embodiments, the synthetic resin layers 6, 11, 21, 31, 51, 71, 91 are configured as cuboid-shaped layers, which are disposed in parallel to the chip 41. However, any configurations of the synthetic resin layers 6, 11, 31, 51, 71, 91 are possible, and also any arrangements, wherein the cuboids can also be arranged in a way not parallel to the chip 41.

The synthetic resin layers 6, 11, 21, 31, 51, 71, 91 serve to electrically insulate the chip 41 and the chip spare contact 46. Alternatives for the synthetic resin layer 6, 11, 21, 31, 51, 71, 91 are layers of any insulating material, such as further types of synthetic material.

The above embodiments have shown that rewiring of existing unhoused chips, for example bare dices, can be performed via depositing an electrically conductive layer.

The fact that before only wafer level processes had been available for rewiring and bumping, has led to a significantly lower industrial usage of unhoused chips than expected, since no prototyping possibilities existed for pre-tests. In contrast, the above embodiments offer a rewiring technology for individual chips, which allows more flexibility during production of the same, and which makes production of different prototypes easier. Maskless production of such prototypes with individual design via stereolithography allows the production of a low cost rewired prototype.

In other words, according to the above embodiments, the synthetic resin layer 6 and layers that can be below the same (not shown) are produced via stereolithography. Thereby, the liquid synthetic resin, which can be designed as photopolymer, is cured via the exposure with a UV laser layer by layer corresponding to the CAD data. Then, the platform is lowered by one layer thickness. Thereby, the liquid synthetic material is evenly distributed on the surface via a wiper. The laser controlled by computer via a moveable mirror moves on the new layer across the curable areas.

The above embodiments have shown that a method for depositing a conductive trace 81 is characterized in that after the production of a block from the synthetic resin layers 6, 11, 21, 31, 51, the contact can be deposited directly locally without tools and without usage of photoresist. Thereby, production of a mask is not required.

At the same time, it becomes clear from the above embodiments, that depositing the conductive trace 81 via producing a recess in the synthetic resin layer 71 can be performed via stereolithography, and then, the contact channel, which is here performed as conductive trace, can be produced via application by doctor of a conductive material into the local window comprising a recess.

The above embodiments have also shown that for producing the whole electrically conductive contact channel, which comprises the conductive trace 81, additionally, the block consisting of the layers 11, 21, 31, 51 is dipped into a basin with conductive resin, and then the whole electrically conductive contact channel, which is here embodied as conductive trace 81, can be locally deposited via stereolithography.

Additionally, the above embodiments have shown that the conductive parts of rewiring can be produced by depositing metallic layers without external current.

The above embodiments have also shown that prior to depositing the contact channel, which comprises the conductive trace 81, a conductive trace contact 61 can be deposited on the chip contact according to a method of the above-described embodiments.

Preferably, the conductive trace contact 61 has dimensions similar to the chip contact 46. According to a method of the above embodiments, a conductive trace contact window 101 can be deposited on the conductive trace 81. Advantageously, the conductive trace contact window 101 is characterized by dimensions similar to the contact bump 111.

While this invention has been described in terms of several preferred embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for producing a chip module, comprising:
   providing a chip with a chip contact;
   preparing a first part of the insulating structure having a recess;
   introducing the chip with a chip contact into the recess of the first part of the insulating structure; and
   generating a second part of the insulating structure via a stereolitography step, so that the second part of the insulating structure covers the chip and the chip contact at least partly, the step of generating comprising the following substeps:
      distributing a synthetic resin on an exposed side of the chip, so that the synthetic resin penetrates into a gap between the recess and the chip and seals the gap;
      exposing and curing the synthetic resin such that the chip contact is in a hole of a cured synthetic resin layer;
   forming a conductive trace, which is connected to the chip contact in the hole of the cured synthetic resin layer in an electrically conductive way; and
      depositing a spare contact on the external surface of the insulating structure, so that the spare contact is connected to the chip contact via the conductive trace in an electrically conductive way;
   the step of forming a conductive trace comprising the following substeps:
      providing the second part of the insulating structure with a recess; and
      introducing a conductive material into at least part of the recess via application by doctor to form at least part of the conductive trace.

2. The method for producing a chip module according to claim 1, wherein the chip is an unhoused diced wafer piece.

3. The method for producing a chip module according to claim 1, wherein the step of generating the insulating structure comprises a step of curing.

4. The method for producing a chip module according to claim 1, wherein the step of introducing the conductive material comprises at least partly dipping the insulating structure into a basin filled with the conductive material or a material underlying the conductive material.

5. The method for producing a chip module according claim 1, wherein the step of generating the insulating structure comprises the steps of:
   providing at least part of the insulating structure, so that the part of the insulating structure covers the chip or the chip contact at least partly;
   seeding part of an external surface of the part of the insulating structure; and
   dipping the part of the insulating structure into a material comprising the conductive material or a material underlying the conductive material;
   wherein the chip comprises an integrated circuit coupled to the chip contact.

6. The method for producing a chip module according to claim 5, wherein the step of dipping the part of the insulating structure comprises currentless depositing of a conductive material or a material underlying the conductive material.

* * * * *